(12) United States Patent
Ji et al.

(10) Patent No.: US 8,514,571 B2
(45) Date of Patent: *Aug. 20, 2013

(54) HORIZONTAL SUBRACK AND COMMUNICATION CABINET

(75) Inventors: Shengqin Ji, Shenzhen (CN); Yuping Hong, Shenzhen (CN); Yongchao He, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,080

(22) Filed: Jan. 20, 2012

(65) Prior Publication Data

US 2012/0120600 A1 May 17, 2012

Related U.S. Application Data

(63) Continuation of application No. 12/818,792, filed on Jun. 18, 2010, now Pat. No. 8,223,492, which is a continuation of application No. PCT/CN2008/073718, filed on Dec. 25, 2008.

(30) Foreign Application Priority Data

Feb. 22, 2008 (CN) .......................... 2008 1 0007994

(51) Int. Cl.
*H05K 7/20* (2006.01)
*A47B 81/00* (2006.01)

(52) U.S. Cl.
USPC ................. 361/693; 361/679.51; 361/679.5; 361/694; 361/695; 361/679.48; 361/679.49; 454/184

(58) Field of Classification Search
USPC ............... 454/184; 361/679.53, 687, 679.51, 361/679.5, 692, 694, 695, 679.48, 679.49; 61/695
See application file for complete search history.

(56) References Cited

U.S. PATENT DOCUMENTS

| 5,168,171 A | 12/1992 | Tracewell |
| 5,339,221 A | 8/1994 | Conroy-Wass et al. |

(Continued)

FOREIGN PATENT DOCUMENTS

| CN | 2160086 A | 3/1994 |
| CN | 1652675 A | 8/2005 |

(Continued)

OTHER PUBLICATIONS

First Action Interview Pilot Program Pre-Interview Communication dated Dec. 28, 2011 in connection with U.S. Appl. No. 12/818,792.

(Continued)

*Primary Examiner* — Anatoly Vortman

(57) ABSTRACT

A horizontal subrack includes a ventilation box, a fan box and a board area. The ventilation box is located on the top and/or at the bottom of the board area, and includes an air partition plate, an air inlet, and a first air outlet; the air partition plate is set inside the ventilation box, and divides the ventilation box into an air-in chamber and an air-out chamber; the fan box is installed in the air-in chamber, and a fan is installed on the fan box; the air inlet is set on the front wall of the ventilation box; and the first air outlet is set on the rear wall of the ventilation box. The board area includes board slots, an air-in duct and an air-out duct.

8 Claims, 4 Drawing Sheets

(56) References Cited

U.S. PATENT DOCUMENTS

| | | | |
|---|---|---|---|
| 5,914,858 | A | 6/1999 | McKeen et al. |
| 6,819,563 | B1 * | 11/2004 | Chu et al. .................... 361/696 |
| 6,924,981 | B2 | 8/2005 | Chu et al. |
| 6,927,980 | B2 | 8/2005 | Fukuda et al. |
| 6,987,673 | B1 | 1/2006 | French et al. |
| 7,016,191 | B2 | 3/2006 | Miyamoto et al. |
| 7,042,720 | B1 | 5/2006 | Konshak et al. |
| 7,046,513 | B2 * | 5/2006 | Nishiyama et al. ........... 361/695 |
| 7,054,155 | B1 | 5/2006 | Mease et al. |
| 7,139,170 | B2 | 11/2006 | Chikusa et al. |
| 7,154,748 | B2 | 12/2006 | Yamada |
| 7,187,547 | B1 | 3/2007 | French et al. |
| 7,215,552 | B2 | 5/2007 | Shipley et al. |
| 7,262,962 | B1 | 8/2007 | McLeod et al. |
| 7,286,345 | B2 * | 10/2007 | Casebolt ................... 361/679.48 |
| 7,295,442 | B2 | 11/2007 | Garnett et al. |
| 7,365,976 | B2 * | 4/2008 | Fujiya et al. .................. 361/695 |
| 7,558,056 | B2 | 7/2009 | Suzuki et al. |
| 7,813,121 | B2 | 10/2010 | Bisson et al. |
| 7,859,834 | B2 * | 12/2010 | Fukuda et al. ........... 361/679.46 |
| 2003/0053293 | A1 | 3/2003 | Beitelmal et al. |
| 2004/0109288 | A1 | 6/2004 | Beitelmal et al. |
| 2004/0264128 | A1 | 12/2004 | Crippen et al. |
| 2006/0176665 | A1 | 8/2006 | Matsushima et al. |
| 2007/0002536 | A1 | 1/2007 | Hall et al. |
| 2007/0274039 | A1 | 11/2007 | Hamlin |
| 2008/0055846 | A1 | 3/2008 | Clidaras et al. |
| 2008/0094799 | A1 | 4/2008 | Zieman et al. |
| 2008/0113604 | A1 | 5/2008 | Tufford et al. |
| 2009/0244842 | A1 | 10/2009 | Iwakiri |

FOREIGN PATENT DOCUMENTS

| | | |
|---|---|---|
| CN | 1852648 A | 10/2006 |
| CN | 101072491 A | 11/2007 |
| JP | 2002319785 A | 10/2002 |

OTHER PUBLICATIONS

International Search Report dated Mar. 26, 2009 in connection with International Patent Application No. PCT/CN2008/073718.

Written Opinion of the International Searching Authority dated Mar. 26, 2009 in connection with International Patent Application No. PCT/CN2008/073718.

Office Action dated Sep. 26, 2011 in connection with U.S. Appl. No. 12/818,792.

* cited by examiner

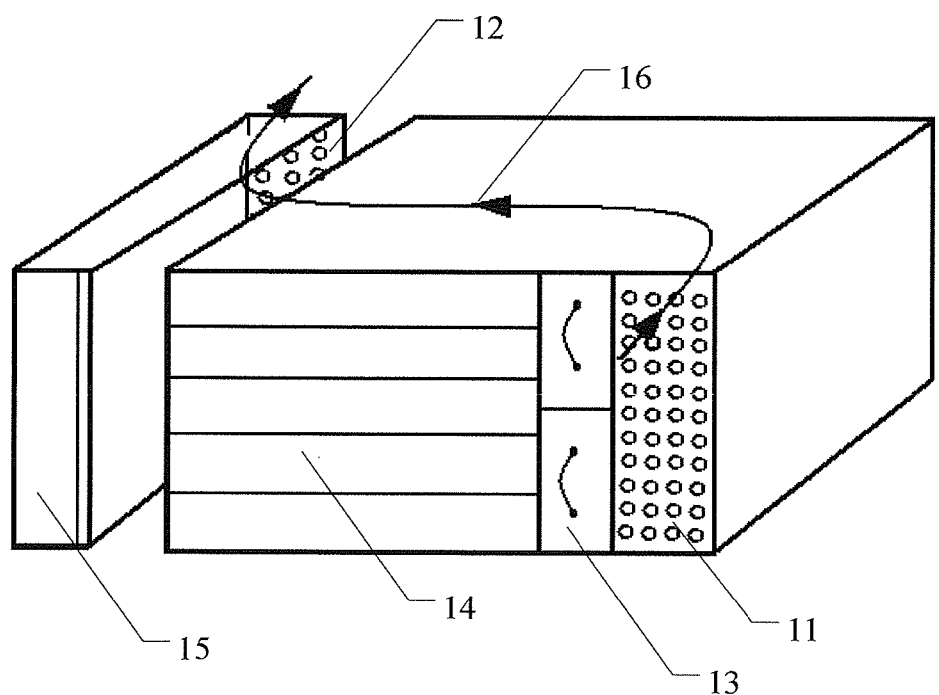
FIG. 1 --Prior Art--
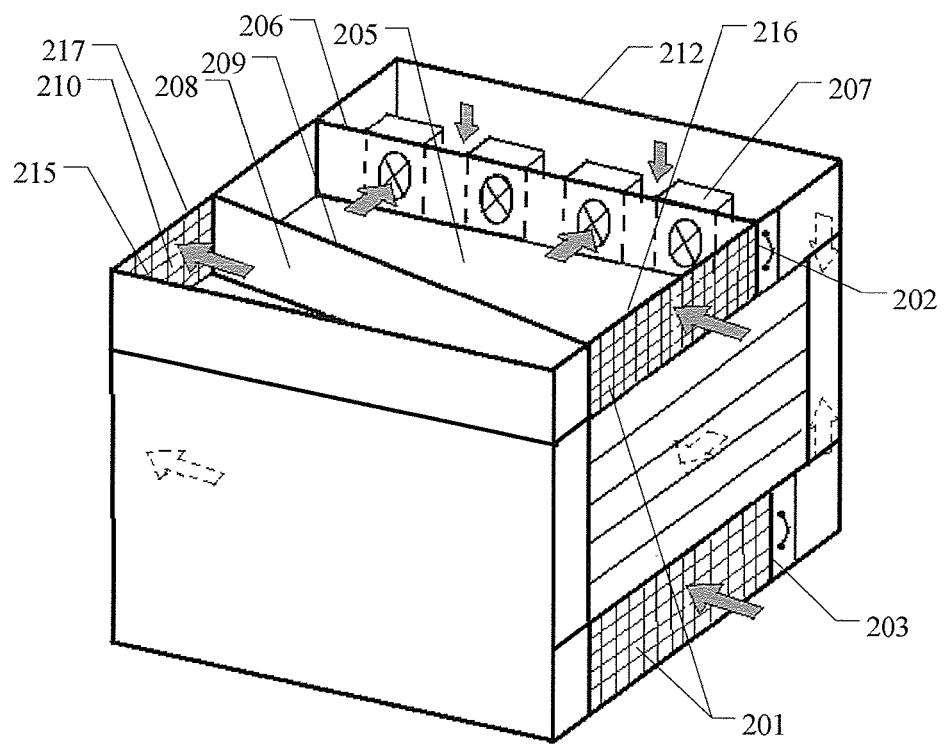
FIG. 2

HORIZONTAL SUBRACK AND COMMUNICATION CABINET

CROSS-REFERENCE TO RELATED APPLICATIONS

This application is a continuation of U.S. patent application Ser. No. 12/818,792, filed on Jun. 18, 2010, which is a continuation of International Application No. PCT/CN 2008/073718, filed on Dec. 25, 2008, which claims the priority of Chinese Patent Application No. 200810007994.4, filed on Feb. 22, 2008, both of which are hereby incorporated by reference in their entireties.

TECHNICAL FIELD

The present invention relates to electronic and communication equipment, and in particular, to a horizontal subrack for holding board devices.

BACKGROUND

When horizontal subracks are configured in the electronic and communication equipment cabinet, horizontal subracks indifferent forms (for example, with a lengthwise air duct, or with a widthwise air duct) may exist in the same cabinet. FIG. 1 shows a horizontal subrack with a lengthwise air duct in the prior art. The horizontal subrack includes a board area 14. Boards are located in the board area 14, and a fan box 13 is located on the right side of the board area 14. The fan is installed in the fan box 13. A ventilation box is set on the right side of the fan box 13, and multiple air inlets 11 are set in the front of the ventilation box. An air deflector box 15 is located on the left side of the board area 14, and a first air outlet 12 is set at the rear of the air deflector box 15.

When the boards in the board area 14 need to dissipate heat, the external airflow enters through the air inlet 11. Under the effect of the axial flow fan, the airflow enters the board area 14 to dissipate heat for the boards in the board area 14, and then flows out of the first air outlet 12 of the air deflector box on the left side of the board area.

In the process of developing the present invention, the inventor finds at least the following defects in the prior art:

The horizontal subrack uses an axial flow fan to dissipate heat. Because the widthwise dimension of the horizontal subrack is limited, the axial flow fan blows the cool air onto the board directly. As affected by the fan hub, the cool air from the fan is not mixed sufficiently before arriving at the board area. Consequently, the air volume is not even for the board slots in the board area of the horizontal subrack, which is a bottleneck of enhancing the heat dissipation capability of the horizontal subrack.

SUMMARY

The embodiments of the present invention provide a horizontal subrack and a communication cabinet to improve the evenness of the air volume to the slots of the horizontal subrack and overcome the bottleneck of enhancing the heat dissipation capability of the horizontal subrack.

The horizontal subrack and the communication cabinet provided in an embodiment of the present invention are fulfilled through the following technical solution.

The horizontal subrack includes a ventilation box, a fan box, and a board area.

The ventilation box is located on the top and/or at the bottom of the board area, and includes an air partition plate, an air inlet, and a first air outlet.

The air partition plate is set inside the ventilation box, and divides the ventilation box into an air-in chamber and an air-out chamber.

The fan box is set in the air-in chamber, and a fan is installed on the fan box.

The air inlet is set on the front wall of the ventilation box, and is located in the air-in chamber.

The first air outlet is set on the rear wall of the ventilation box, and is located in the air-out chamber.

The board area includes board slots, an air-in duct, and an air-out duct. The air-in duct is located on one side of the board slots, and the air-out duct is located on the other side of the board slots. The air-in duct is linked to the air-in chamber, and the air-out duct is linked to the air-out chamber.

Another horizontal subrack provided in an embodiment of the present invention includes: a ventilation box, a fan box, and a board area.

The ventilation box is located on the top and/or at the bottom of the board area, and includes an air partition plate, an air inlet, and a first air outlet.

The air partition plate is set inside the ventilation box, and divides the ventilation box into an air-in chamber and an air-out chamber.

The fan box is set on the rear wall of the board area, and a fan is installed on the fan box.

The air inlet is set on the front wall of the ventilation box, and is located in the air-in chamber.

The first air outlet is set on the rear wall of the ventilation box, and is located in the air-out chamber.

The board area includes board slots, an air-in duct, and an air-out duct. The air-in duct is located on one side of the board slots, and the air-out duct is located on the other side of the board slots. The air-in duct is linked to the air-in chamber, and the air-out duct is linked to the air-out chamber.

The communication cabinet provided in an embodiment of the present invention includes a horizontal subrack. The horizontal subrack includes a ventilation box, a fan box, and a board area.

The ventilation box is located on the top and/or at the bottom of the board area, and includes an air partition plate, an air inlet, and a first air outlet.

The air partition plate is set inside the ventilation box, and divides the ventilation box into an air-in chamber and an air-out chamber.

The fan box is set in the air-in chamber or on the rear wall of the board area, and a fan is installed on the fan box.

The air inlet is set on the front wall of the ventilation box, and is located in the air-in chamber.

The first air outlet is set on the rear wall of the ventilation box, and is located in the air-out chamber.

The board area includes board slots, an air-in duct, and an air-out duct. The air-in duct is located on one side of the board slots, and the air-out duct is located on the other side of the board slots. The air-in duct is linked to the air-in chamber, and the air-out duct is linked to the air-out chamber.

Evidently, the horizontal box and the communication cabinet extend the trail from the fan box to the board area, and significantly reduce the impact of the airflow onto the fan hub. The cool air from the fan is mixed sufficiently before arriving at the board area, and the air volume is allocated evenly to the board slots in the horizontal subrack. Therefore, the heat dissipation capability of the horizontal subrack is enhanced.

BRIEF DESCRIPTION OF THE DRAWINGS

FIG. 1 shows a structure of a horizontal subrack in the prior art;

FIG. 2 shows a structure of a first type of horizontal subrack in an embodiment of the present invention;

DETAILED DESCRIPTION

The horizontal subrack provided in an embodiment of the present invention includes: a ventilation box, a fan box, and a board area.

The ventilation box is located on the top and/or at the bottom of the board area, and includes an air partition plate, an air inlet, and a first air outlet.

The air partition plate is set inside the ventilation box, and divides the ventilation box into an air-in chamber and an air-out chamber.

The fan box is set in the air-in chamber or on the rear wall of the board area, and a fan is installed on the fan box.

The air inlet is set on the front wall of the ventilation box, and is located in the air-in chamber.

The first air outlet is set on the rear wall of the ventilation box, and is located in the air-out chamber.

The board area includes board slots, an air-in duct, and an air-out duct. The air-in duct is located on one side of the board slots, and the air-out duct is located on the other side of the board slots. The air-in duct is linked to the air-in chamber, and the air-out duct is linked to the air-out chamber.

Evidently, the horizontal box extends the trail from the fan box to the board area, and reduces the impact of the airflow onto the fan hub massively. The cool air from the fan is mixed sufficiently before arriving at the board area, and the air volume is allocated evenly to the board slots in the horizontal subrack. Therefore, the heat dissipation capability of the horizontal subrack is enhanced.

The technical solution under one embodiment of the present invention is described in more detail with reference to the accompanying drawings.

Figure 3:
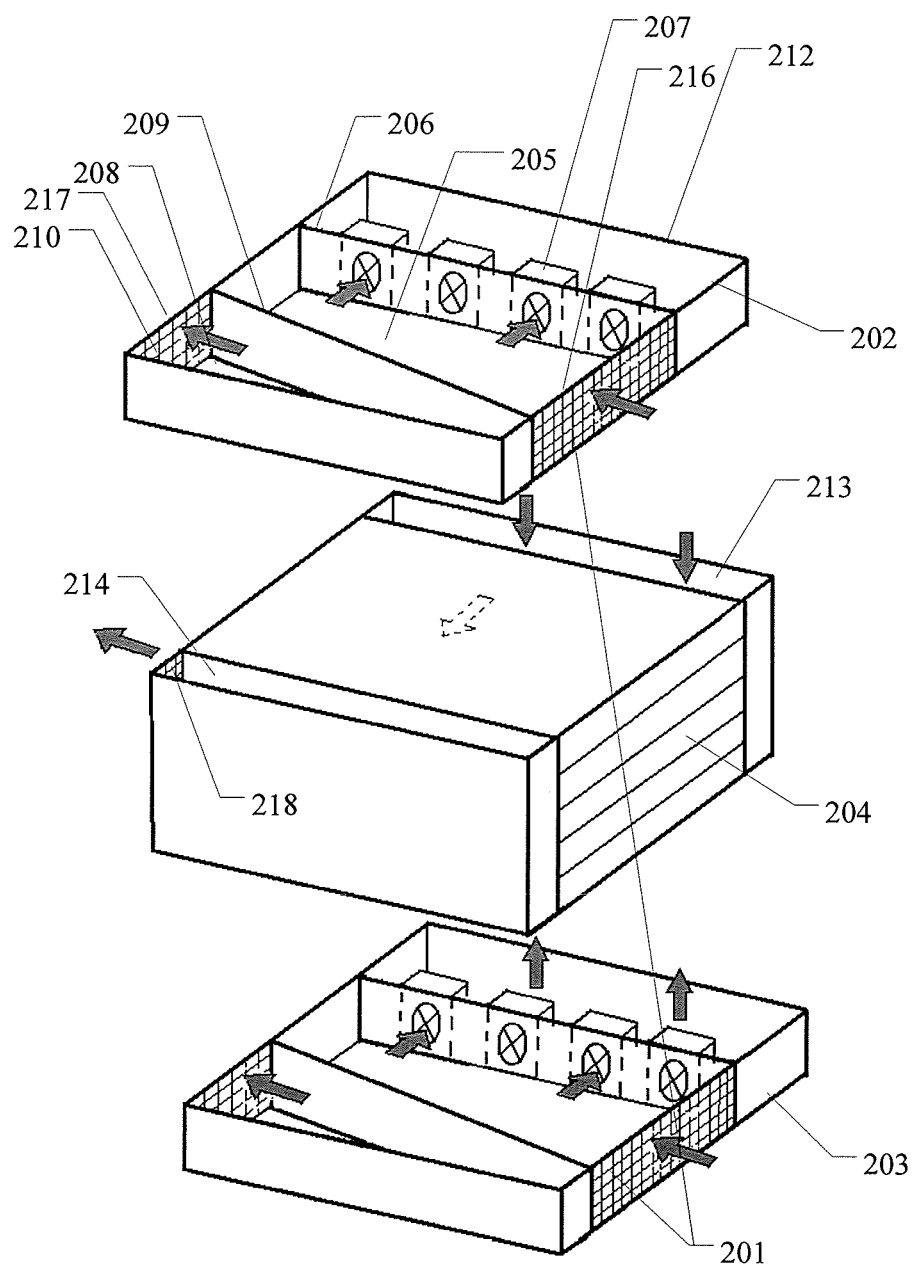
FIG. 3 shows a structure of a second type of horizontal subrack in an embodiment of the present invention.

FIG. 2 is an exploded view of a first type of horizontal subrack in an embodiment of the present invention, and FIG. 3 shows a structure of a first type of horizontal subrack already installed in an embodiment of the present invention. In FIG. 2 and FIG. 3, the top cover plate of the horizontal subrack is removed.

The horizontal subrack includes: a ventilation box 202, a ventilation box 203, and a board area 204. The ventilation box 202, the ventilation box 203, and the board area 204 are independent of each other. They are installed together to form a complete horizontal subrack shown in FIG. 3. The ventilation box 202 and the ventilation box 203 are located on the top and at the bottom of the board area 204 respectively. In this embodiment, the structure of the ventilation box 202 is the same as that of the ventilation box 203. The structure of the ventilation box 202 is described below.

The ventilation box 202 includes an air-in chamber 205, an air-out chamber 208, an air inlet 201, a first air outlet 210, an air partition plate 209, a fan box 206, and a fan 207.

The air partition plate 209 is set in the ventilation box 202, and divides the ventilation box 202 into an air-in chamber 205 and an air-out chamber 208. The air-in chamber 205 is located on one side (such as the right side) of the air partition plate 209, and the air-out chamber 208 is located on the other side (such as the left side) of the air partition plate 209. The air-in chamber 205 is an area between the air partition plate 209 and the right sidewall 212 of the ventilation box 202, and the air-out chamber 208 is an area between the air partition plate 209 and the left sidewall 215 of the ventilation box 202. The air inlet 201 of the air-in chamber 205 is set on the front wall 216 of the ventilation box 202, and the first air outlet 210 of the air-out chamber 208 is set on the rear wall 217 of the ventilation box 202.

The fan box 206 is located between the air partition plate 209 and the right sidewall 212 of the horizontal subrack, and divides the air-in chamber 205 into two areas, and is located above the board area 204. A fan 207 is installed on the fan box 206. There may be one or more fans 207 for inhaling external cool air into the air-in chamber 205.

The central part of the horizontal subrack is a board area 204. The board area 204 includes board slots, an air-in duct 213, and an air-out duct 214. The air-in duct 213 is located on one side (for example, right side) of the board slot, and the air-out duct 214 is located on the other side (for example, left side) of the board slot. The board slot is adapted to hold a board, and a gap for air ventilation exists between every two board slots. The air inlet of the air-in duct 213 is linked to the outlet of the air-in chamber 205 of the ventilation box 202. The air-out duct 214 is linked to the first air outlet 210 of the air-out chamber 208. The rear wall of the air-out duct 214 may have a second air outlet 218.

The cool air enters the ventilation box 202 through the air inlet 201. Under the effect of the fan 207, the cool air passes through the air-in chamber 205, the air-in duct 213, and then goes into the board slot of the board area 204. The cool air flows through the gaps between board slots in the board area 204 to dissipate heat of components, and enters the air-out chamber 208 through the air-out duct 214 before being expelled from the horizontal subrack through the first air outlet 210 and the second air outlet 218.

In the horizontal subrack provided in this embodiment, the ventilation box is set on the top and at the bottom of the horizontal subrack. An air-in chamber and an air-out chamber are set in the ventilation box, and the fan box is set in the air-in chamber and located above the board area, thus prolonging the trail between the fan and the board slot. The cool air is distributed evenly before entering the board area 204. Therefore, the impact on the fan hub is eliminated, which is caused by blowing air to the board area directly, and the evenness of distributing the air volume to the slots in the horizontal subrack is improved.

Figure 5:
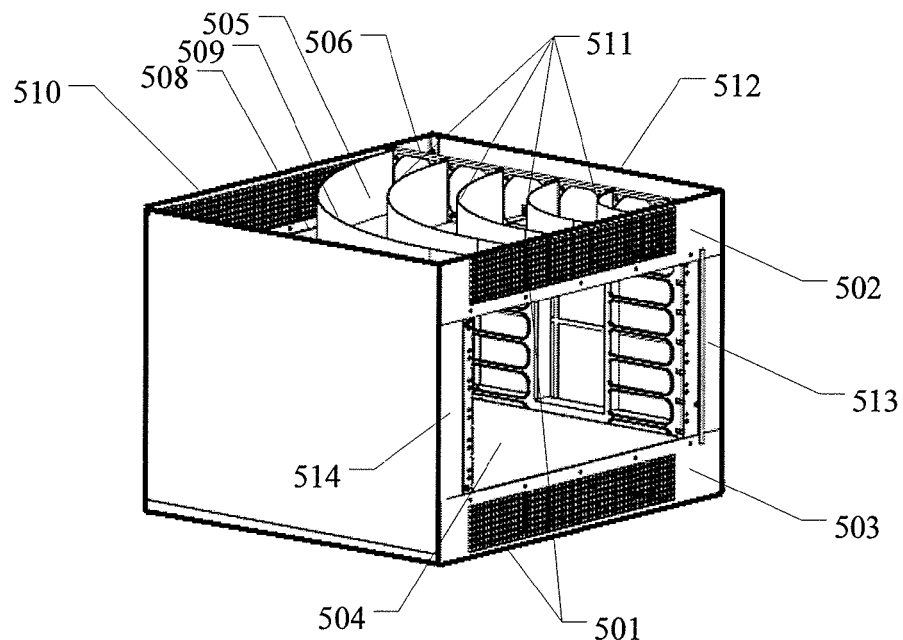
FIG. 5 shows a structure of a third type of horizontal subrack in an embodiment of the present invention.

In this embodiment, the ventilation box 202, the ventilation box 203, and the board area 204 are independent of each other. Therefore, the user may select the proper ventilation box and the quantity of ventilation boxes to match the board area 204 according to the size of the system power consumption and the quantity of the board slots. As shown in FIG. 5, when there are few (for example, 2 or 3) slots in the subracks, a ventilation box may be installed on the top or at the bottom of the main body of the horizontal subrack, and a proper fan is installed to dissipate heat.

Alternatively, the ventilation box 202, the ventilation box 203, and the board area 204 are set to a whole. In this way, the impact on the fan hub is eliminated, which is caused by blowing air to the board area directly, and the evenness of distributing the air volume to the slots in the horizontal subrack is improved.

Figure 4:
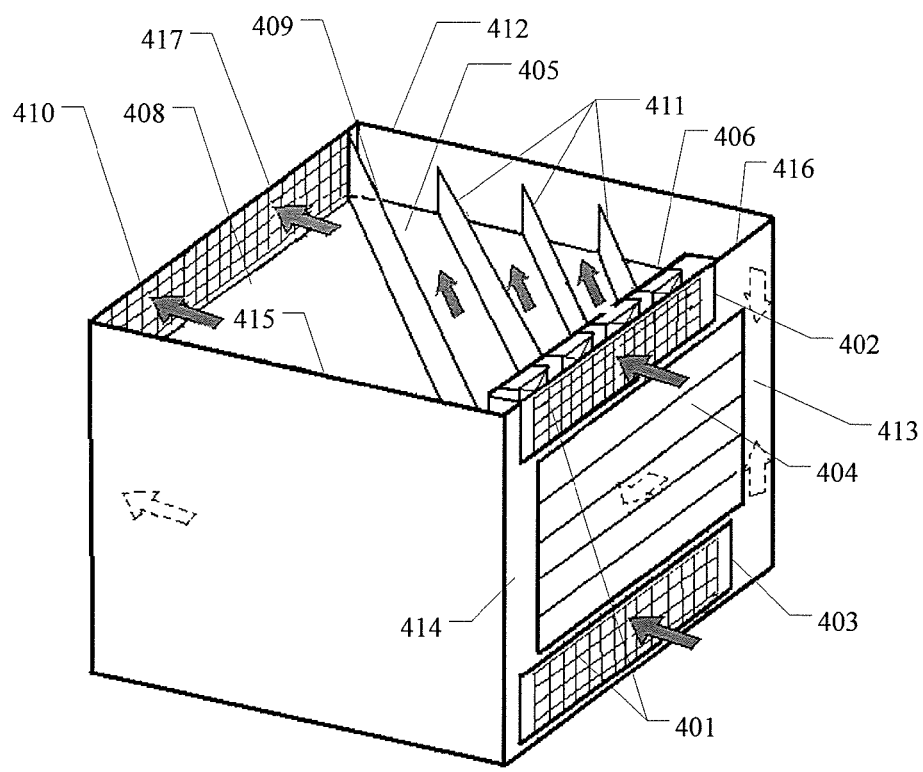
FIG. 4 is an exploded view of a second type of horizontal subrack in an embodiment of the present invention.

FIG. 4 shows a structure of a second type of horizontal subrack in an embodiment of the present invention. As shown in FIG. 4, the top cover plate is removed from the horizontal subrack. In the structure of the horizontal subrack, the air enters the subrack from the front of the subrack, and flows out at the rear of the subrack, and the airflow in the board area flows from one side to the other.

The horizontal subrack includes a ventilation box 402, a ventilation box 403, and a board area 404. The ventilation box 402 and the ventilation box 403 are located on the top and at the bottom of the board area 404 respectively. In this embodiment, the ventilation box 402 at the upper part of the horizontal subrack is structurally the same as the ventilation box 403 at the lower part of the horizontal subrack. Therefore, only the structure of the ventilation box 402 is described herein.

The ventilation box 402 includes an air-in chamber 405, an air-out chamber 408, an air inlet 401, a first air outlet 410, an air partition plate 409, a fan box 406, and a fan 407.

The air partition plate 409 for isolating the hot air from the cool air is located on the diagonal of the four edges of the ventilation box 402, and divides the ventilation box 402 into an air-in chamber 405 and an air-out chamber 408. The air-in chamber 405 is located on one side (such as the right side) of the air partition plate 409, and is an area between the air partition plate 409 and the right sidewall 412 of the ventilation box 402. The air-out chamber 408 is located on the other side (such as the left side) of the air partition plate 409, and is an area between the air partition plate 409 and the left sidewall 415 of the ventilation box 402. The air inlet 401 of the air-in chamber 405 is set on the front wall 416 of the ventilation box 402, and the first air outlet 410 of the air-out chamber 408 is set on the rear wall 417 of the ventilation box 402.

The central part of the horizontal subrack is a board area 404. The board area 404 includes board slots, an air-in duct 413, and an air-out duct 414. The air-in duct 413 is located on one side (for example, right side) of the board slot, and the air-out duct 414 is located on the other side (for example, left side) of the board slot. The board slot is adapted to hold a board, and a gap for air ventilation exists between every two board slots. The air inlet of the air-in duct 413 is linked to the outlet of the air-in chamber 405 of the ventilation box 402. The air-out duct 414 is linked to the first air outlet 410 of the air-out chamber 408. The rear wall of the air-out duct 414 also has a second air outlet.

The fan box 406 is set in the air-in chamber 405, and is parallel to the front wall 416 of the ventilation box 402, and is close to the air inlet 401. One or more fans are installed on the fan box 406.

In this embodiment, a deflecting plate 411 is set in the air-in chamber 405. The deflecting plate 411 partitions the fans 407 from each other on the fan box 406, and is parallel to the air partition plate 409. The deflecting plate 411 divides the air-in chamber 405 into multiple areas along the depth direction of the horizontal subrack.

The cool air enters the ventilation box 402 through the air inlet 401 under the effect of the fan, passes through the air-in chamber 405, the board area 404 and the air-in duct 413, and then arrives at the board slots of the board area 404. The cool air is mixed sufficiently before entering the board area 404. The cool air flows through the gaps between board slots in the board area 404 to dissipate heat of components, and enters the air-out chamber 408 through the air-out duct 414 in the board area 404 before being expelled from the horizontal subrack through the first air outlet 410 and the second air outlet.

This horizontal subrack differs from the first type of horizontal subrack described above in that: A deflecting plate 411 is set along the depth direction of the second type of fan box 406. The deflecting plate 411 divides the air-in chamber 405 into multiple areas along the depth direction of the air partition plate 409, thus ensuring evenness of distributing airflow along the depth direction of the fan box, and making the airflow impose less impact on the fan hub. Moreover, a deflecting plate is set inside the ventilation box (the deflecting plate may be in other shapes). Therefore, the airflow of the fan at the inlet is further improved, the airflow of the fan at the outlet spreads sufficiently, turbulence is reduced, and the system pressure loss is reduced. Because each fan has its independent air-in duct, cross-interference is eliminated between fans. The working points of the fan are optimized, and the system noise is reduced efficiently.

FIG. 5 shows a third type of horizontal subrack provided in an embodiment of the present invention. Such horizontal subrack differs from that shown in FIG. 4 in that: The air partition plate 509 is arcual, and the deflecting plate 511 divides the air-in chamber 505 into multiple arcual areas along the depth direction of the horizontal subrack. The deflecting plate 511 is parallel to the air partition plate 509, and is also arcual (or in other shapes). The fan box 506 is located between the right sidewall 512 of the ventilation box 502 and the deflecting plate 511, and is parallel to the right sidewall 512. The deflecting plate 511 begins with the air inlet 501 and ends at the fan box 506. The deflecting plate 511 makes the airflow that passes through each fan form a separate channel. The horizontal subrack shown in FIG. 5 may produce the technical effect of the horizontal subrack shown in FIG. 4.

Figure 6:
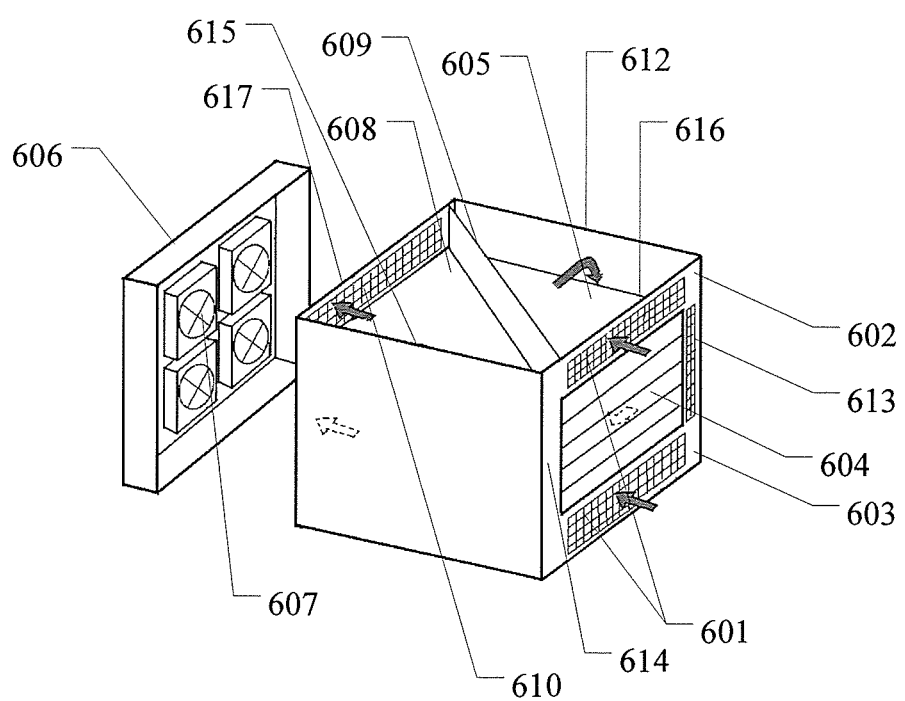
FIG. 6 shows a structure of a fourth type of horizontal subrack in an embodiment of the present invention.

FIG. 6 shows a structure of a fourth type of horizontal subrack in an embodiment of the present invention. As shown in FIG. 6, the top cover plate is removed from the horizontal subrack. In the structure of the horizontal subrack, the air enters the subrack from the front of the subrack, and flows out at the rear of the subrack, and the airflow in the board area flows from one side to the other.

The horizontal subrack includes a ventilation box 602, a ventilation box 603, and a board area 604. The ventilation box 602 and the ventilation box 603 are located on the top and at the bottom of the board area 604 respectively. In this embodiment, the ventilation box 602 at the upper part of the horizontal subrack is structurally the same as the ventilation box 603 at the lower part of the horizontal subrack. Therefore, only the structure of the ventilation box 602 is described herein.

The ventilation box 602 includes an air-in chamber 605, an air-out chamber 608, an air inlet 601, a first air outlet 610, an air partition plate 609, a fan box 606, and a fan 607.

The air partition plate 609 for isolating the hot air from the cool air is located on the diagonal of the four edges of the ventilation box 602, and divides the ventilation box 602 into an air-in chamber 605 and an air-out chamber 608. The air-in chamber 605 is located on one side (such as the right side) of the air partition plate 609, and is an area between the air partition plate 609 and the right sidewall 612 of the ventilation box 602. The air-out chamber 608 is located on the other side (such as the left side) of the air partition plate 609, and is an area between the air partition plate 609 and the left sidewall 615 of the ventilation box 602. The air inlet 601 of the air-in chamber 605 is set on the front wall 616 of the ventilation box 602, and the first air outlet 610 of the air-out chamber 608 is set on the rear wall 617 of the ventilation box 602.

The fan box 606 is located on the rear wall of the board area, and is close to the rear wall 617 of the board area. The fan box 606 covers the first air outlet 610 on the rear wall 617 of the ventilation box and the rear wall of the board area 604. One or more fans 607 are installed on the fan box 706.

The central part of the horizontal subrack is a board area 604. The board area 604 includes board slots, an air-in duct 613, and an air-out duct 614. The air-in duct 613 is located on one side (for example, the right side) of the board slot, and the air-out duct is located on the other side (for example, the left side) of the board slot. The board slot is adapted to hold a board, and a gap for air ventilation exists between every two board slots. The air inlet of the air-in duct 613 is linked to the outlet of the air-in chamber 605 of the ventilation box 602. The air-out duct 614 is linked to the first air outlet 610 of the air-out chamber 608. The rear wall of the air-out duct 614 may have a second air outlet.

The cool air enters the ventilation box 602 through the air inlet 601. Under the effect of the fan 607, the cool air passes through the air-in chamber 605 and the air-in duct 613 and arrives at the board slots in the board area 604, thus prolonging the trail between the fan and the board. The cool air is mixed sufficiently, thus eliminating the impact on the fan hub, which is caused by the direct air blown by the fan to the board area 604, and improving the evenness of the air volume distributed to the board slots. The mixed cool air flows through the board area 604 to dissipate heat for the components, and passes through the air-out duct 614 and the air-out chamber 608 before being expelled from the horizontal subrack through the first air outlet 610 and the second air outlet.

In this embodiment, the fan box is located at the rear of the horizontal subrack, and covers the first outlet, the second outlet, and the rear wall of the board area, thus facilitating installation of large-size fans without the need of increasing the height of the horizontal subrack.

Further, the fan box 606 may be set in front of the ventilation box 602 to accomplish the objectives of the present invention.

In the embodiments described above, different ventilation boxes may be installed on the top and at the bottom of the board area separately; or, if the board area is small, the ventilation boxes may be installed only on the top or only at the bottom of the board area, with a view to dissipating heat for the board components.

A communication cabinet provided in an embodiment of the present invention includes a horizontal subrack. The horizontal subrack includes a ventilation box, a fan box, and a board area.

The ventilation box is located on the top and/or at the bottom of the board area, and includes an air partition plate, an air inlet, and a first air outlet.

The air partition plate is set inside the ventilation box, and divides the ventilation box into an air-in chamber and an air-out chamber.

The fan box is set in the air-in chamber or on the rear wall of the board area, and a fan is installed on the fan box.

The air inlet is set on the front wall of the ventilation box, and is located in the air-in chamber.

The first air outlet is set on the rear wall of the ventilation box, and is located in the air-out chamber.

The board area includes board slots, an air-in duct, and an air-out duct. The air-in duct is located on one side of the board area, and the air-out duct is located on the other side of the board area. The air-in duct is linked to the air-in chamber, and the air-out duct is linked to the air-out chamber.

Further, a second air outlet is set on the rear wall of the air-out duct, and the airflow of the board area passes through the air-out chamber and the air-out duct before being expelled from the first air outlet and the second air outlet.

Further still, the fan box is set in the air-in chamber in this way: The fan box is installed inside the air-in chamber and located between the air partition plate and the right sidewall of the ventilation box.

Further still, the fan box is set in the air-in chamber in this way: The fan box is installed inside the air-in chamber and is close to the front wall of the ventilation box.

Further still, a deflecting plate is set in the depth direction of the air partition plate in the air-in chamber of the ventilation box. The deflecting plate isolates one fan from another, and divides the air-in chamber into a certain number of areas, where the number is equal to the number of fans.

Further still, the deflecting plate is an arcual plate or a straight plate.

Further still, the deflecting plate is parallel to the air partition plate.

Elaborated above are a horizontal subrack and a communication cabinet under the present invention. Although the invention is described through some exemplary embodiments, the invention is not limited to such embodiments. It is apparent that those skilled in the art can make modifications and variations to the invention without departing from the scope of the invention. The invention is intended to cover such modifications and variations provided that they fall in the scope of protection defined by the following claims or their equivalents.

What is claimed is:

1. A horizontal subrack comprising at least one ventilation box, a fan box, and a board area, wherein
    the at least one ventilation box is located on the top or at the bottom of the board area, and includes an air partition plate, an air inlet, and a first air outlet;
    the air partition plate is set inside the ventilation box, and divides the ventilation box into an air-in chamber and an air-out chamber;
    the fan box is set in the air-in chamber, and a fan is installed on the fan box;
    the air inlet is set on the front wall of the ventilation box, and is located in the air-in chamber;
    the first air outlet is set on the rear wall of the ventilation box, and is located in the air-out chamber;
    the board area comprises board slots, an air-in duct, and an air-out duct, the air-in duct is located on one side of the board slots, the air-out duct is located on the other side of the board slots, the air-in duct is linked to the air-in chamber, and the air-out duct is linked to the air-out chamber.

2. The horizontal subrack according to claim 1, wherein the fan box is set in the air-in chamber in this way: the fan box is installed inside the air-in chamber and is close to the front wall of the ventilation box.

3. The horizontal subrack according to claim 1, wherein a deflecting plate is set in the depth direction of the air partition plate in the air-in chamber of the ventilation box, the deflecting plate isolates one fan from another and divides the air-in chamber into a certain number of areas, where the number is equal to the number of fans.

4. The horizontal subrack according to claim 3, wherein the deflecting plate is a straight plate.

5. A communication cabinet comprising a horizontal subrack, and the horizontal subrack comprises at least one ventilation box, a fan box, and a board area, wherein
    the at least one ventilation box is located on the top or at the bottom of the board area, and comprises an air partition plate, an air inlet, and a first air outlet;
    the air partition plate is set inside the ventilation box, and divides the ventilation box into an air-in chamber and an air-out chamber;
    the fan box is set in the air-in chamber, and a fan is installed on the fan box;
    the air inlet is set on the front wall of the ventilation box, and is located in the air-in chamber;
    the first air outlet is set on the rear wall of the ventilation box, and is located in the air-out chamber;

the board area comprises board slots, an air-in duct, and an air-out duct, the air-in duct is located on one side of the board slots, the air-out duct is located on the other side of the board slots, the air-in duct is linked to the air-in chamber, and the air-out duct is linked to the air-out chamber.

6. The communication cabinet according to claim 5, wherein a second air outlet is set on the rear wall of the air-out duct, and the airflow of the board slots passes through the air-out chamber and the air-out duct before being expelled from the first air outlet and the second air outlet.

7. The communication cabinet according to claim 5, wherein the fan box is set in the air-in chamber in this way: the fan box is installed inside the air-in chamber and is close to the front wall of the ventilation box.

8. The communication cabinet according to claim 7, wherein a deflecting plate is set in the depth direction of the air partition plate in the air-in chamber of the ventilation box, the deflecting plate isolates one fan from another and divides the air-in chamber into a certain number of areas, where the number is equal to the number of fans.

* * * * *